United States Patent [19]

Erben et al.

[11] 4,183,320
[45] Jan. 15, 1980

[54] APPARATUS FOR NICKEL PLATING

[75] Inventors: Edwin Erben; Ladislav Koydl, both of Munich, Fed. Rep. of Germany

[73] Assignee: Maschinenfabrik Augsburg-Nürnberg Aktiengesellschaft, Fed. Rep. of Germany

[21] Appl. No.: 825,472

[22] Filed: Aug. 17, 1977

[30] Foreign Application Priority Data

Aug. 21, 1976 [DE] Fed. Rep. of Germany ....... 2637836

[52] U.S. Cl. .................................... 118/725; 118/316; 118/318; 427/50; 427/237

[51] Int. Cl.² ............................................... B05B 1/02

[58] Field of Search ...................... 118/49.1, 49.5, 315, 118/316, 318, 622; 427/50, 51, 237, 252

[56] References Cited

U.S. PATENT DOCUMENTS

| | | | |
|---|---|---|---|
| 2,781,280 | 2/1957 | Miller | 118/316 X |
| 2,792,806 | 5/1957 | Pawlyk | 118/318 X |
| 3,050,417 | 8/1962 | Nack et al. | 118/49.5 X |
| 3,196,826 | 7/1965 | Norris | 118/622 X |
| 3,484,276 | 12/1969 | Burggraaf et al. | 118/318 X |
| 3,748,169 | 7/1973 | Keller | 118/49.1 X |
| 3,865,647 | 2/1975 | Reuschel | 427/51 X |
| 4,030,964 | 6/1977 | Schieber et al. | 118/49.1 X |

FOREIGN PATENT DOCUMENTS

| | | | |
|---|---|---|---|
| 47-12925 | 4/1972 | Japan | 118/49.1 |
| 48-2834 | 1/1973 | Japan | 118/49.1 |

*Primary Examiner*—Wm. Carter Reynolds
*Attorney, Agent, or Firm*—Scully, Scott, Murphy & Presser

[57] ABSTRACT

A method and apparatus for the nickel-plating of components, in which the finished component, which is to be nickel-plated, is heated to a temperature between 150° and 200° C. and is at the same time subjected to a continuously flowing gas stream containing nickeltetracarbonyl (Ni(CO)$_4$) and an entrainment gas. In this procedure nickel is constantly desposited from the gas phase on the heated surface from the gas stream which continuously flows around the finished component and consists of an entrainment gas and nickeltetracarbonyl. The nickel coating produced by this procedure adheres well, given normal pre-cleaning, and is practically seal-tight even in very thin coating thicknesses (0.1–1μ).

1 Claim, 1 Drawing Figure

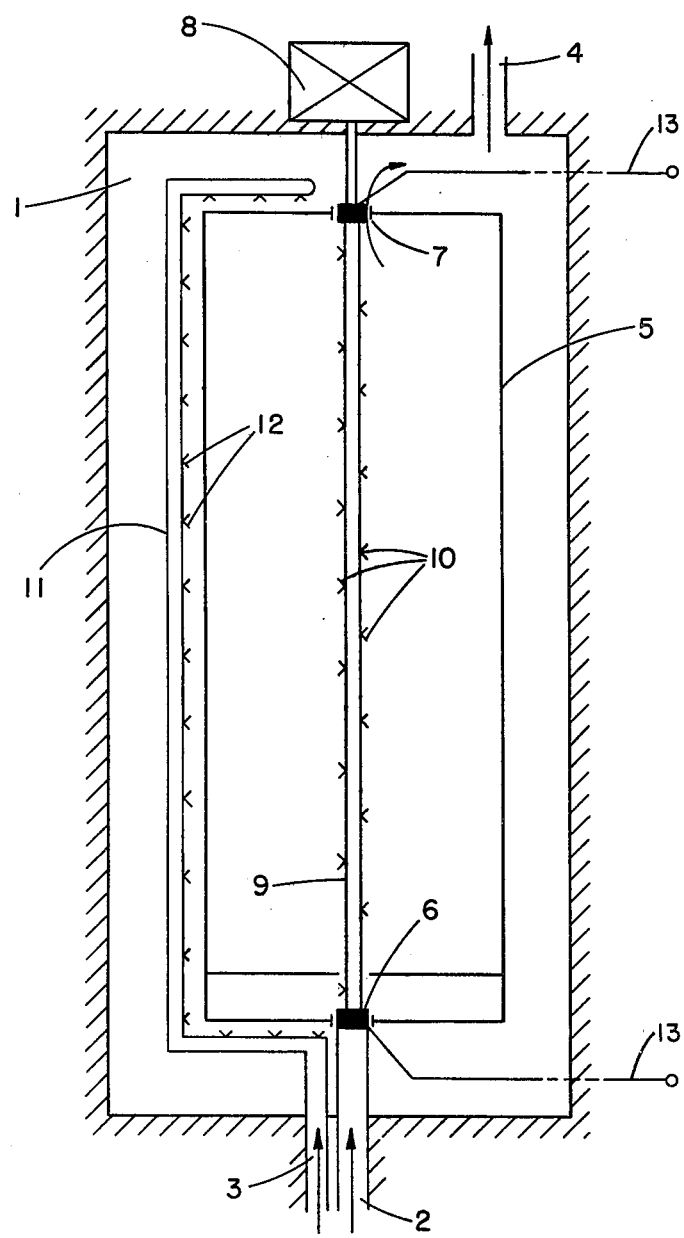

APPARATUS FOR NICKEL PLATING

The invention relates to a method for nickel-plating a finished component. The invention also relates to an apparatus for carrying out the method.

In the course of producing uranium for energy generating plants it is necessary to perform isotope separation in the course of which the required U235 must be separated from the U238, contained mainly in the uranium metal. Uranium hexafluoride (UF$_6$), which is the subject of the actual separating procedure, is produced as an intermediate product in order to perform such isotope separation. This gas is not only radioactive but also exceptionally corrosive to other materials, a feature which renders its handling exceptionally difficult. The efficiency of separating plants is basically very low, i.e. to obtain a specific quantity of the desired end product calls for an exceptionally large expenditure in terms of plant investment. It therefore necessarily follows that plants must remain in operation over decades if they are to be profitable. In conjunction with the above remarks this means that all plant parts in contact with the process gas must be corrosion-resistant, not only temporarily, but permanently.

An additional difficulty is also present: as soon as the process gas comes into contact with hydrogen, for example with moisture, HF is formed, a substance which is even more corrosive to other materials than UF$_6$. An exceptional complexity is therefore involved in the driving of separating plants before these are taken into operation and this step cannot prevent that basically traces of HF are already present in industrially produced UF$_6$. Only very few materials, such as nickel, can withstand the combined attack of UF$_6$ and HF for a prolonged period. It is unfortunately not possible for all those parts of an isotope separating plant which are in contact with the process gas to be manufactured from a completely resistant material because a resistant material often does not have the properties which are compellingly necessary for other technological reasons. Coating with nickel, for example by an electroplating process, has been found impossible in many cases because of the required thickness of the coating: for example, the demands made on the nozzle characteristics and geometry of separating nozzles are so stringent and the nozzle dimensions are so small that hitherto it was impossible for the material to be coated with a coating which was on the one hand sufficiently impermeable to the process gas and is therefore sufficiently dense and is on the other hand sufficiently thin.

It is therefore the object of the invention to provide a method for the nickel-plating of components, which method at least partially avoids the initially-mentioned disadvantages of the known processes. It is also the object of the invention to provide apparatus for the particularly advantageous nickel-plating of the centrifuging drums of gas centrifuges.

According to the invention this problem is solved in that the finished component, which is to be nickel-plated, is heated to a temperature between 150° and 200° C. and is at the same time subjected to a continuously flowing gas stream containing nickeltetracarbonyl (Ni(CO)$_4$) and an entrainment gas. In this procedure nickel is constantly deposited from the gas phase on the heated surface from the gas stream which continuously flows around the finished component and consists of an entrainment gas and nickeltetracarbonyl. The nickel coating produced by this procedure adheres well, given normal pre-cleaning, and is practically seal-tight even in very thin coating thicknesses (0.1–1$\mu$). It was therefore possible, where necessary, to directly coat a finished component, even one of very complex shape, with an exceptionally thin and practically seal-tight nickel coating. With this method, it is also possible, where necessary, to apply relatively thick coatings because it is possible to achieve a depositing rate of up to 250 $\mu$/h.

Coating by the method according to the invention can be performed particularly advantageously, especially for components of complicated shape: by contrast to a liquid electrolyte the coating gas penetrates even haircracks and coats their surfaces, a feature which does not always occur in electroplating as already mentioned. In the method according to the invention the formation of self-supporting coatings can be substantially suppressed so that the nickel coating can be damaged only together with the component but hardly by itself.

The formation of the coating and the local coating thickness in the method according to the invention can be substantially influenced by guiding or local concentration of the coating gas stream; more particularly, the "edge effect" which is particularly undesirable in electroplating, can be suppressed and is due to the fact that the electric current density at the edges is particularly high so that the coating thickness produced on sharp edges by electroplating is greater than on flat surfaces. With the method according to the invention it is of course possible for a component, for example a finished component, to be subjected to different gas flows and thus to cater for coating thicknesses which are locally thicker or thinner. It is also possible to influence the formation of the coating by local heating or cooling of the component. Finally, in coating components for a uranium isotope separating plant it is particularly advantageous that the component need not be immersed into a "wet" electrolyte for the coating procedure since the residues of such electrolyte could directly lead to the local formation of HF when the component is taken into operation.

In one embodiment of the invention it is particularly advantageous that the gas stream comprises 5 to 100 percent by volume of nickeltetracarbonyl and 95 to 0 percent by volume of entrainment gas. Within this particularly advantageous range it is possible to select gas concentrations which produce a different coating thickness on a uniformly heated component subjected to the same treatment time.

Basically, a variety of entrainment gases can be used and these need merely satisfy the requirement that they do not directly react either with nickeltetracarbonyl or with the component which is to be coated. From this great variety of possible gases three have been found particularly advantageous and according to further alternative embodiments of the invention argon, helium or nitrogen is used as the entrainment gas. Argon and helium are particularly suitable for the coating of metallic materials, for example the ultra high tensile so-called Maraging steel, which is used in gas centrifuges, for example in the peripheral region of the centrifuging drums thereof. Being rare gases, argon and helium offer the additional advantage that the coating procedure is not affected by any undesirable side reaction. Nitrogen has been found particularly suitable as entrainment gas for the coating of finished components in isotope separating plants since this gas also assists in drying the surface which is to be coated. Nitrogen is in any case used as an inert gas for specially endangered parts of an isotope separating plant and until it is taken into operation such a part is stored in the nitrogen atmosphere in order to prevent the ingress of air humidity. When using nitrogen as the entrainment gas it is therefore particularly advantageous to continue the gas treatment after the coating operation but only with pure entrainment gas in which the finished coated component is then stored after the coating procedure.

Any final operation such as final balancing of a centrifuging drum is no longer necessary because of the exceptionally thin coating thicknesses which can be achieved by the method according to the invention; moreover, owing to the excellent adhesion properties of the nickel coating the method according to the invention has been found so reliable that in some circumstances it is possible to dispense with a final inspection. The coating operation according to the invention can therefore be combined with the final moisture removal and packaging in the course of producing a component for isotope separating plants.

Heating of the finished component, which is to be coated in the method according to the invention, can be performed in different ways; for example it is advantageous to indirectly heat the finished component by introducing a thermal fluid into cavities which are not to be coated, or to heat it locally by the attachment of heating elements, for example to obtain a nickel coating of locally different thickness. Within the scope of a further embodiment of the invention it is particularly advantageous if electric current flows through the component for heating and by suitable positioning of different electrodes it is possible to obtain practically any desired temperature characteristic on the surface for coating in a particularly simple manner. It is also possible to provide temperature control in a particularly simple manner because the electric current, as cause for the temperature rise, is controllable in inertia free manner; it is therefore possible to store a control procedure which has been found to be particularly advantageous and to repeat such procedure with each new identical finished component that is to be coated; it is also possible to control the temperature characteristics directly by means of thermal sensors. This embodiment is particularly advantageous when used in conjunction with rotationally symmetrical components through which current needs to flow merely along their longitudinal axis so that they are heated and coated with such uniformity that no unbalance is produced after the application of a coating, even a thick coating.

Heating by electric current has additional advantages under special conditions: components which are lightly stressed and because of such light stress are not produced with the degree of care required for highly stressed components may contain hairline cracks on welds, soldered places or other joints, such cracks being intrinsically harmless but because of the moisture deposited in these cracks can give rise to the formation of HF; since the material thickness through which current flows in such zones diminishes the temperature therefore rises and with a corresponding increase in nickel deposits so that a nickel coating of greater thickness is automatically formed at particularly hazardous places.

Basically the method of the present invention can be performed in any suitable device; a particularly advantageous embodiment of the invention incorporates an apparatus for nickel plating the centrifuging drum of a gas centrifuge and comprises a stationary reaction chamber with gas inlet means, a gas outlet and an electrically conductive rotatable support adapted to receive the centrifuging drum and connected to a circuit, one support being coaxial with the other and at least one support being capable of being rotated by driving means. As already mentioned above it is particularly advantageous for a rotationally symmetrical member that current flows axially through it. To obtain the particularly high degree of accuracy required for the extremely highly stressed centrifuging drum of a gas centrifuge, the latter is set into rotation by means of the apparatus according to the invention during the coating operation so that any localised coating gas concentration cannot produce a locally thicker coating but only a greater coating thickness which is distributed over the circumference but in itself does not form an unbalance; the reaction chamber for receiving the centrifuging drum can therefore be kept relatively small because no special significance is then attached to the uniform distribution of the coating gas; it is merely necessary that the flow through the reaction chamber via the inlet and outlet is constant. A further advantage of the invention is due to the fact that the gas inlet means comprises two tubes with outlet ports of which one interconnects the two supports along the axis of rotation and the other is arranged in stationary configuration along the contour of the centrifuging drum with its discharge ports directed towards the drum. Coating gas enters through these two tubes into the reaction chamber which has an outlet for maintaining the necessary throughput flow. One of the tubes biasses the interior of the centrifuging drum while the other of the two tubes allows coating gas to flow to the surface of the drum through nozzles while the drum is in constant rotation during the coating operation as already explained above. This ensures that each surface of the drum is subjected to coating gas without the need for supplying unnecessary quantities of coating gas to the reaction chamber. It is even possible to provide a larger reaction chamber for receiving several centrifuging drums where such construction according to the invention ensures that the same accurately meterable quantity of gas is conducted over the surface of each drum. The reaction gas introduced into the reaction chamber and the current applied to each centrifuging drum therefore gives a direct indication of the coating thickness on the centrifuging drum.

The accompanying drawing FIGURE shows in diagrammatic form an apparatus for nickel plating the centrifuge drum of a gas centrifuge.

At its bottom end a reaction chamber 1 is provided with two inlet tubes 2 and 3 and its top end is provided with a discharge tube 4. A centrifuging drum 5 of a gas centrifuge is arranged concentrically within the cylindrical reaction chamber 1 and is supported at its bottom and lid by a top and bottom contact ring 6, 7 respectively. Each of the two contact rings 6 and 7 are connected to part of a circuit by terminals 13 which is closed by the centrifuging drum. Both contact rings are rotatably mounted and the top contact ring 7 is connected to a motor 8 by means of which the contact ring 7 and also therefore the centrifuging drum 5 can be rotated. To ensure a reliable electric contact between the contact rings 6, 7 and the centrifuging drum 5 it is necessary to ensure a clean, registered fit, through which the driving torque of the motor 8 can also be transmitted.

The bottom contact ring is drilled and is rotatable, but is disposed on the inlet tube 2 in substantially gas-tight manner. Through the ring extends a spray tube 9 which in turn is arranged coaxially with the centrifuging drum 5 and extends into the contact ring 7. A plurality of uniformly distributed nozzles 10 is drilled into the circumference of the spray tube 9 and coating gas emerges from said nozzles into the interior of the gas centrifuge. The gas acts upon the internal walls of the centrifuging drum 5 before it escapes through discharge ports (not shown) into the reaction chamber 1. Discharge ports of this kind can be formed, for example, by bores in the top contact ring 7.

For coating an extremely thin centrifuging drum comprising many elements the spray tube 9 can be constructed so that it supports the centrifuging drum 5 and the forces resulting from the weight thereof can be transferred via the coating gas inlet tube 2 into the reaction chamber.

A second coating gas inlet tube is arranged eccentrically adjacent to the coating gas inlet tube in the bottom of the reaction chamber 1 and extends into a contour tube 11. The contour tube 11 surrounds the centrifuging drum 5 in the manner of a template and therefore has a top and bottom portion extending substantially radially with respect to the centrifuging drum and a long portion extending substantially axially parallel with the centrifuging drum. These portions are arranged adjacent the end, side and bottom surface of the centrifuging drum and have spray nozzles 12 which are directed towards the centrifuging drum and from which the gas introduced to the tube 3 is discharged directly to the wall of the centrifuging drum 5. After the coating has come into contact with the surface of the centrifuging drum 5 it leaves the reaction chamber 1 through the discharge tube 4.

The reaction chamber 1 illustrated in the drawing and adapted for receiving only one centrifuging drum 5 can also be designed for coating several centrifuging drums if two contact rings, one drive and one coating system comprises a contour tube and spray tube are associated with each drum.

What we claim is:

1. Apparatus for carrying out a method for nickel plating an electrically conductive centrifuging drum of a gas centrifuge, including the steps of passing an electrical current through the drum to heat it to a temperature between 150° and 200° C. and simultaneously subjecting the drum to a continuously flowing gas stream containing nickeltetracarbonyl and an entrainment gas, comprising a stationary reaction chamber with gas inlet means, a gas outlet, and first and second electrically conductive rotatable supports adapted to receive the centrifuging drum and connected to a circuit, one support being coaxial with the other and at least one support being capable of being rotated by driving means, said gas inlet means having two tubes, each provided with discharge ports, the first tube interconnecting the first and second supports along the axis of rotation whilst the second tube is stationary and arranged along the contour of the centrifuging drum with its discharge ports directed towards the drum.

* * * * *